Figure 1:
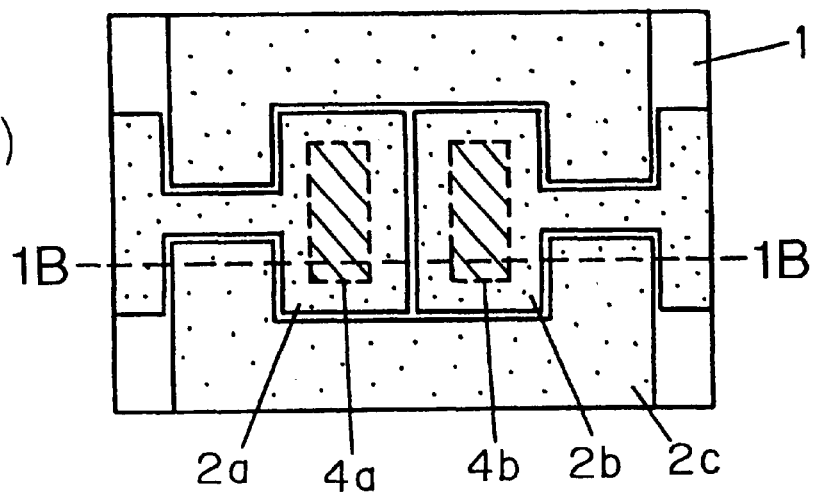
Figure 1:
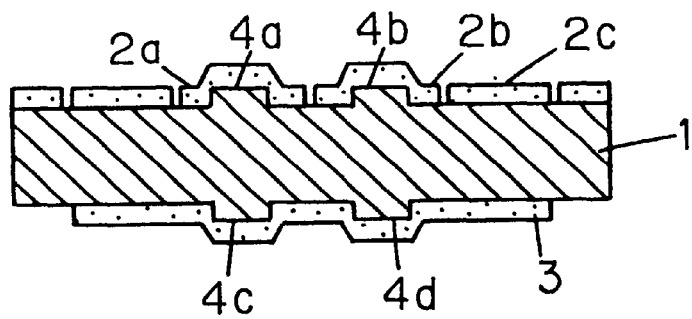
Figure 1:
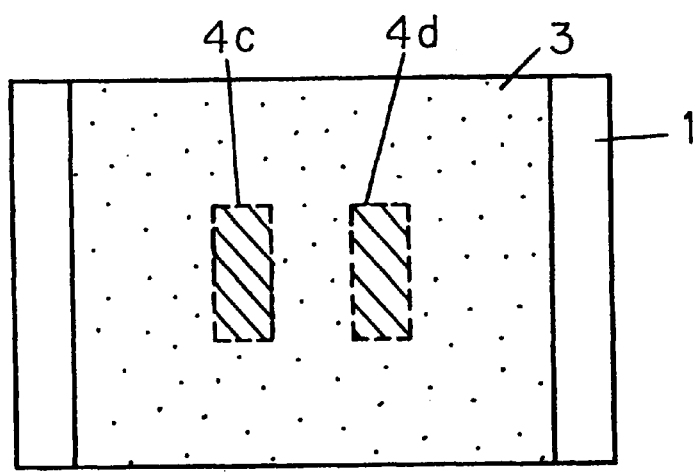

United States Patent [19]
Tomita et al.

[11] Patent Number: 5,969,463
[45] Date of Patent: Oct. 19, 1999

[54] ENERGY TRAPPING PIEZOELECTRIC DEVICE AND PRODUCING METHOD THEREOF

[75] Inventors: Yoshihiro Tomita, Osaka; Tetsuyoshi Ogura, Settsu; Atsushi Komatsu, Katano; Shinji Itamochi, Osaka, all of Japan

[73] Assignee: Matsushita Electric Industrial Co., Ltd., Osaka, Japan

[21] Appl. No.: 08/891,132

[22] Filed: Jul. 10, 1997

[30] Foreign Application Priority Data

Jul. 10, 1996 [JP] Japan .................................. 8-180341

[51] Int. Cl.⁶ .................................................. H01L 41/08
[52] U.S. Cl. ........................ 310/320; 310/366; 310/368; 310/312
[58] Field of Search .................................. 310/320, 321, 310/366–368, 312

[56] References Cited

U.S. PATENT DOCUMENTS

| | | | |
|---|---|---|---|
| 3,401,276 | 9/1968 | Curran et al. | 310/32 |
| 3,760,471 | 9/1973 | Borner | 310/366 |
| 4,211,947 | 7/1980 | Ikeno et al. | 310/312 |
| 4,870,313 | 9/1989 | Hirama et al. | 310/320 |
| 5,235,240 | 8/1993 | Morita et al. | 310/365 |
| 5,283,496 | 2/1994 | Hayashi et al. | 310/312 |
| 5,294,860 | 3/1994 | Gamo | 310/320 |
| 5,422,532 | 6/1995 | Inoue et al. | 310/326 |
| 5,541,469 | 7/1996 | Kaida | 310/367 |
| 5,548,179 | 8/1996 | Kaida | 310/367 |
| 5,701,048 | 12/1997 | Kaida | 310/321 |

FOREIGN PATENT DOCUMENTS

| | | | |
|---|---|---|---|
| 52-17784 | 9/1977 | Japan | 310/368 |
| 53-83490 | 7/1978 | Japan | 310/367 |
| 54-54593 | 4/1979 | Japan | 310/367 |
| 56-122214 | 9/1981 | Japan | 310/312 |
| 59-128813 | 7/1984 | Japan | 310/367 |
| 62-217710 | 9/1987 | Japan | 310/368 |
| 3-195111 | 8/1991 | Japan | 310/367 |
| 4-127705 | 4/1992 | Japan | 310/368 |
| 4-127709 | 4/1992 | Japan | 310/368 |

OTHER PUBLICATIONS

"Elastic Wave Electric Technical Handbook", Japan Society for the Promotion of Science: Elastic Wave Element Technique No. 150 Commission, published by OHM, Nov. 30, 1991, pp. 82 to 89.

*Primary Examiner*—Thomas M. Dougherty
*Attorney, Agent, or Firm*—Ratner & Prestia

[57] ABSTRACT

An energy trapping piezoelectric device trapping a thickness vibration into projections which suppress a reflection of a vibration from end portions of electrodes provided substantially on a piezoelectric plate, and which suppress unnecessary spurious vibrations, low impedance and higher frequency, and a method of easily producing such a piezoelectric device are provided. The piezoelectric device has an energy trapping projection provided over a piezoelectric plate, and a top electrode is divided into a exciting electrode and dummy electrode. A small gap is provided between the divided electrodes, and the electrodes are electrically insulated from each other. The thickness vibration is not generally reflected, and vibrating energies due to the thickness vibrations are substantially trapped into the projections provided on the piezoelectric plate.

13 Claims, 12 Drawing Sheets

ENERGY TRAPPING PIEZOELECTRIC DEVICE AND PRODUCING METHOD THEREOF

2. BACKGROUND OF THE INVENTION a. Field of the Invention

The present invention relates to an electrode and element structure for improving characteristics of an energy trapping thickness resonant piezoelectric device such as a piezoelectric resonator used for generating a high-frequency clock and a multi-mode piezoelectric filter used for processing a high-frequency signal, and relates to a producing method thereof.

b. Description of the Related Art

In recent years, a processing speed and a data transfer speed has become remarkably high in an information device such as a computer and its peripheral devices, and accordingly it is required to generate a high-frequency clock. An energy trapping-type vibrator including a quartz vibrator is used for generation of a high-frequency clock, and thus a high-frequency-type vibrator is required. In the case where high frequency stability is required for a change due to an environment temperature and a deterioration with age, an AT cut quartz is generally used as piezoelectric material. The At cut quartz vibrator has excellent temperature stability of ppm order. In the case where the frequency stability is not required, an energy trapping-type vibrator with piezoelectric ceramic is used.

Figure 10A:
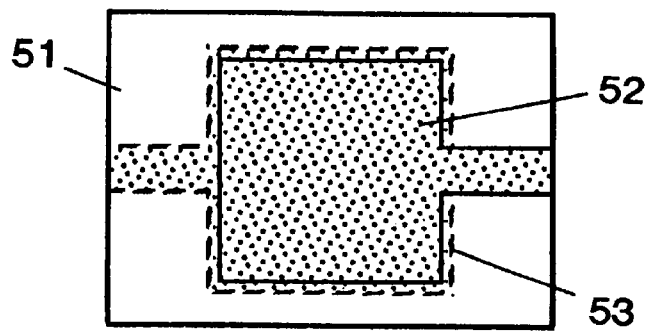
Figure 10B:
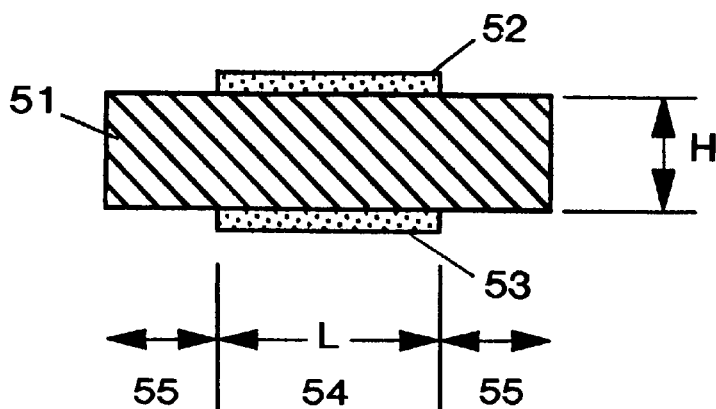
Figure 10C:
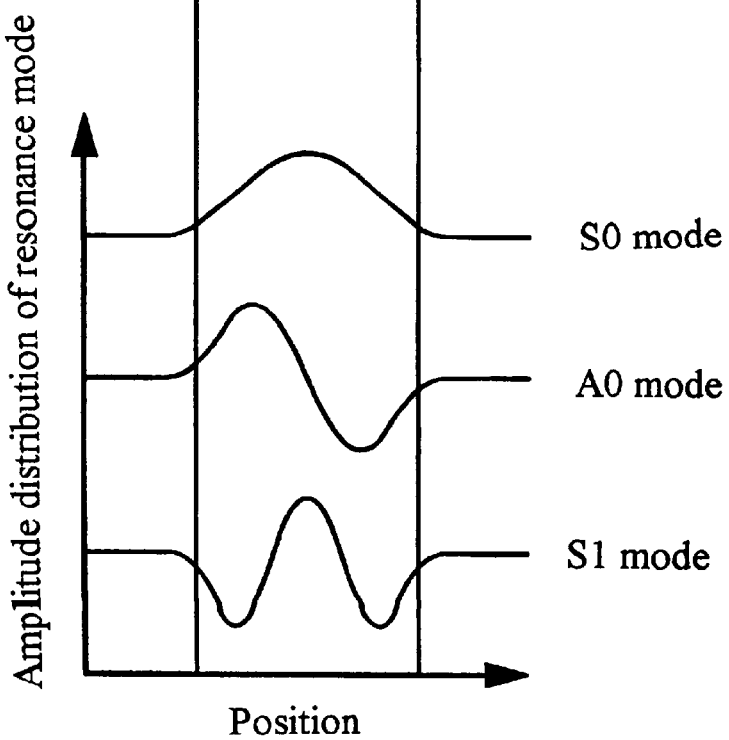

The description will be given as to the energy trapping-type vibrator on reference to FIGS. 10(A) through 10(D). FIG. 10(A) is a top view, FIG. 10(B) is a cross sectional view, and FIG. 10(c) is an amplitude distribution chart of a typical trapped thickness resonant mode. The resonator is composed of a piezoelectric plate 51, exciting electrodes 52 and 53 which are formed on front and rear surfaces of the piezoelectric plate 51 so as to face each other in a narrower extent than the piezoelectric plate. The theory of the energy trapping is described in detail on pages 82 to 89 of "Elastic Wave Electric Technical Handbook" (published by OHM in Nov. 30, 1991, edited by Japan Society for the Promotion of Science: Elastic Wave Element Technique No. 150 Commission). A resonating mode energy which fulfills the condition that the thickness vibration along a thickness vibrating plate surface is propagated by a exciting electrode section 54 and is attenuated by a peripheral non-electrode section 55 is trapped into the exciting electrode section 54. Since the vibration is not propagated through the end surface of the piezoelectric plate 51, the end surface can be easily retained with a package. Since a vibration energy does not leak in the retaining portion, a high Q value can be realized, and influence on the characteristic by the retention is lessened. A difference in the propagation constant between the exciting electrode section 54 and the non-electrode section 55 is shown by the following two effects:

(1) a cut-off frequency decreases due to a mass load such as an electrode; and
(2) a cut-off frequency of the electrode section decreases due to a piezoelectric effect.

In the case of a piezoelectric plate with a small electromechanical coupling factor such as an AT cut quartz thickness shear vibrator, an energy is trapped mainly by the mass load of a provided exciting electrode, and in a piezoelectric ceramic with a large electromechanical coupling factor, the trapping effect such that the piezoelectric effect is overwhelmingly larger is exhibited.

Figure 10D:
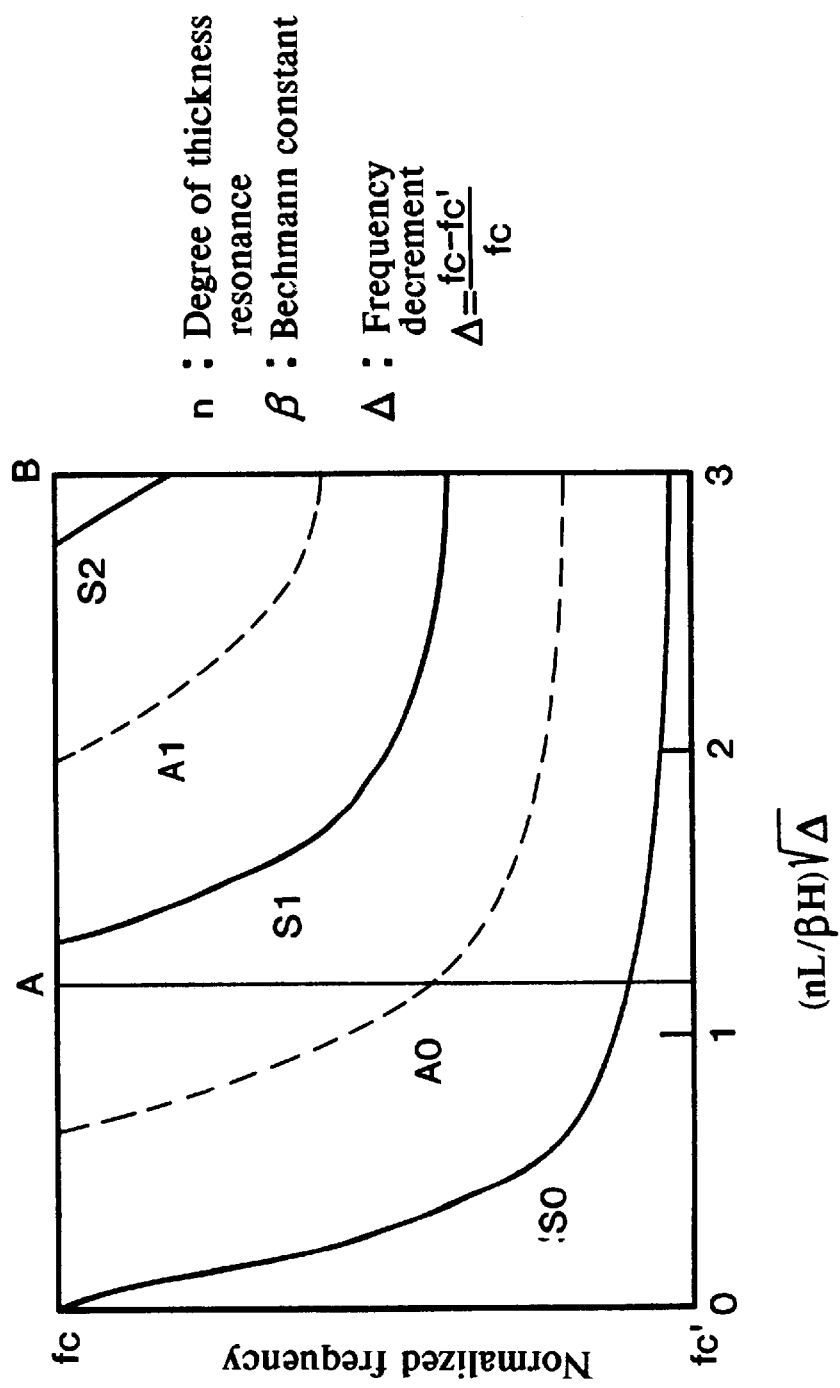

FIG. 10(D) is a frequency chart of a typical resonating mode in the case where a thickness vibration is propagated with above cut-off frequency. A vertical axis represents a frequency, fc represents a cut-off frequency of the non-electrode section, and fc' represents a cut-off frequency of the electrode section. A horizontal axis represents degree of the energy trapping, and the value is represented by a exciting electrode length (L/H) which is standardized by a thickness H of the piezoelectric and a standardized frequency decrement $\Delta(fc-fc')/fc$. Curved lines in the chart represent changes in frequencies of respective resonating modes according to the degree of the energy trapping. S0 and A0 are respectively fundamental resonance of a symmetric mode and anti-symmetric mode, Sn and An (here, n is the order of the thickness resonance, n>1) represents respectively the higher order modes of the symmetric and anti-symmetric modes. In the case of a resonator having symmetric exciting electrode pattern, the anti-symmetric modes can not be excited, because the electromechanical coupling of whole resonating part is completely canceled. In the case of a resonator having no symmetry or a filter, mentioned later, the anti-symmetric modes can be excited.

Here, the conditions of trapping of the respective resonating modes are considered. Since a thickness vibration with a frequency lower than the cut-off frequency of the electrode section and non-electrode section is not propagated through the electrode section and non-electrode section, the trapping does not occur. Moreover, since a thickness vibration with a frequency higher than the cut-off frequency of the electrode section and non-electrode section is propagated through the electrode section and non-electrode section, the trapping does not occur. Therefore, only when the frequency of the thickness vibration is lower than the cut-off frequency of the non-electrode section and higher than the cut-off frequency of the electrode section, the vibration is trapped in the electrode section, and resonance occurs. For example, in the case where the trapping quantity is A in the drawing, S0 is trapped and resonated, but S1 is propagated also through the non-electrode section with a frequency higher than the cut-off frequency of the electrode section and is not trapped, and thus is not resonated. If the trapping quantity is increased to B, not only S0 but also S1 and S2 are trapped and resonated. Namely, if the trapping quantity is A, i.e., a suitable value, the main resonance is only S0, and an excellent vibrator without spurious (unnecessary) resonance can be obtained. Meanwhile, when the trapping quantity is increased by increasing the frequency decrement or by lengthening an electrode length, spurious (unnecessary) resonance occurs. Since the spurious resonance causes a jump of frequencies and unstable operation in a clock generator, the frequency decrement and electrode length should be selected so that the spurious resonance is suppressed.

Next, the energy-trapping-type piezoelectric filter is in great demand with the recent spread of individual mobile communication devices such as portable telephones and pagers. A surface acoustic wave filter and dielectric filter are used in a RF section where a frequency is high and surface acoustic wave filter and quartz filter are used in 1st-IF, and a ceramic filter is used in 2nd-IF, namely, multi-stage filters are used. In these filters, the energy-trapping-type multi-mode piezoelectric filter is a portion of a quartz filter and ceramic filter, and it composes a system with extremely small number of stages. For this reason, these filters require a producing method where the channel selection is varied and the characteristic is stable. Moreover, since a number of portable telephone subscribers has increased rapidly, a number of channels is insufficient, and thus a higher RF frequency is used. Accordingly, an IF filter having a higher frequency is required.

Figure 11:
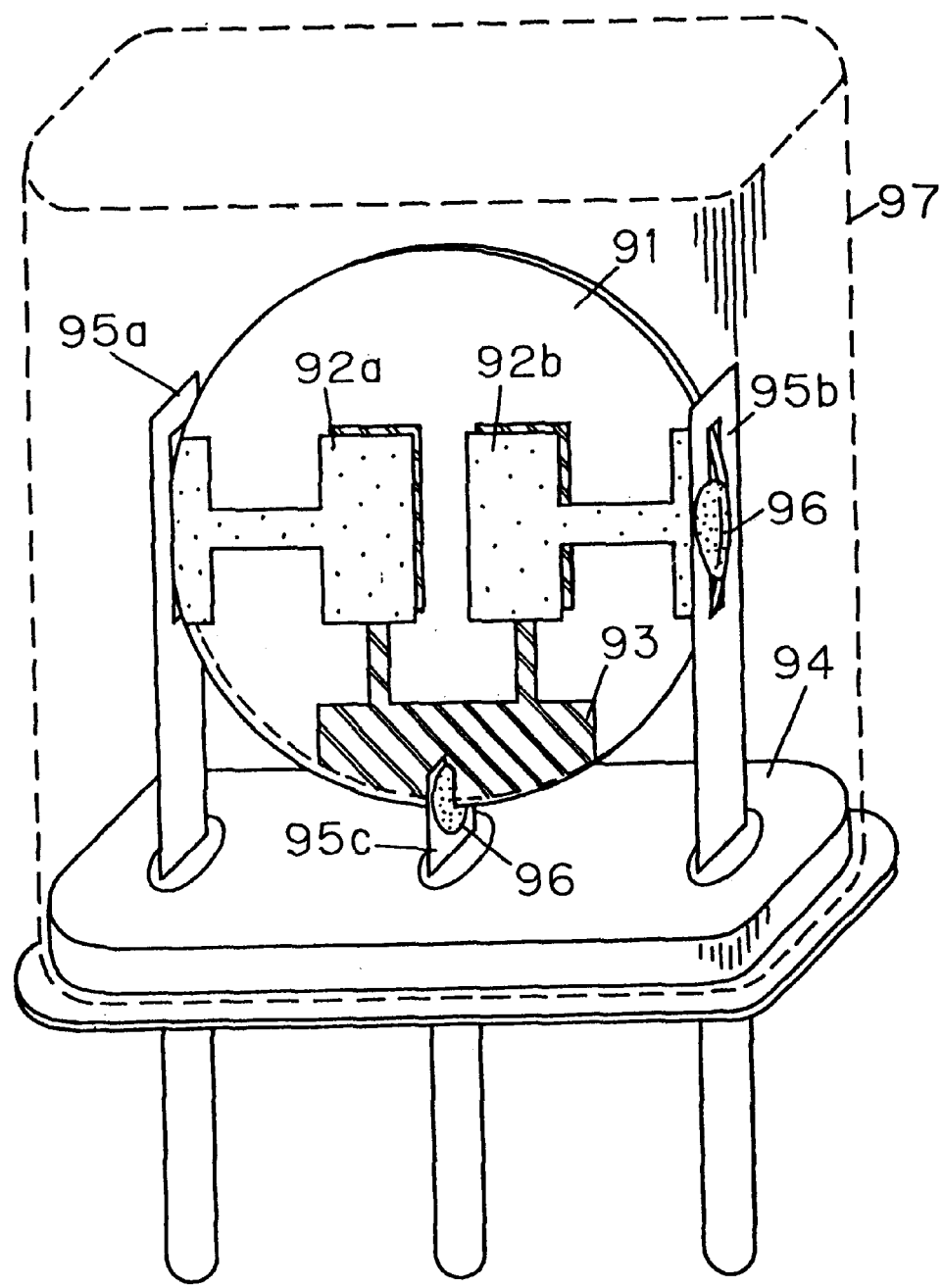

Here, as one example of a conventional energy trapping-type multi-mode piezoelectric filter, a quartz MCF (Monolithic Crystal Filter) is explained on reference to FIG. 11. An AT cut quartz is used as a piezoelectric plate 91, and an input electrode 92a and an output electrode 92b are formed on the front surface of the piezoelectric plate 91, and a common earth electrode 93 is provided to the rear surface of the piezoelectric plate 91. The piezoelectric plate 91 is fixed to pins 95a, 95b and 95c provided on a base 94 of a can package through a conductive paste 96, and the input and output electrodes and the earth electrode are taken out to the outside. Finally, a metallic cap 97 is welded to the base 94 so that the base 94 is sealed.

Similarly to the vibrator, the filter also adopts the theory of the energy trapping, and a thickness vibrating energy is trapped by a mass load into the portion where the electrodes have been formed. The portions of the input electrode 92a and output electrode 92b for respectively different energy trapping vibrators. The two vibrators are positioned at a suitable distance, and when leaked vibration is coupled, the symmetric mode for vibrating input and output sides with the same phase and the anti-symmetric mode for vibrating them with anti-phase (opposite phase) are resonated. When the symmetric and anti-symmetric modes which are propagated from the input side to the output side are controlled, a desired filter characteristic is obtained.

Compared to the vibrator, the filter requires the, more definite electrode design. In the case of the vibrator, the spurious resonance of a higher order mode may be avoided to some degree, but in the case of the filter, it is fundamental that the thickness and size of the electrodes are determined so that the energy is trapped only in the symmetric and anti-symmetric modes which are foundations of the input and output electrodes. If the weight and area of the electrodes are increased, the higher order mode with a high frequency is reflected at the end portions of the electrodes and is resonated, and this causes the spurious resonance. Therefore, the allowable thickness and size of the electrodes are limited, and degree of freedom of the filter design is remarkably restricted.

In the conventional vibrator and filter, gold is used as an electrode material which has stability of a high frequency, a foundation layer such as chrome is used. As the other materials, silver is used to reduce the cost. Further, in the case of a high frequency, metal such as aluminum with small specific gravity is used.

As the low-priced method of forming an electrode thin film pattern on a piezoelectric plate, a metal mask having hole pattern same as the electrode pattern is generally used. In a way which requires higher frequency and the producing method where the more excellent filter characteristic and the stability, higher working accuracy is required, and thus instead of the metal mask, working employing the photolithography method is carried out. In such a strict way, it is necessary to align the pattern of the front electrode with that of the rear electrode accurately, thereby increasing the producing cost.

The can package is explained as embodiment, but with the miniaturization of equipments, small-sized vibrator and filter is required, and thus a piezoelectric plate is mounted into a surface mounting package with the piezoelectric plate being laid.

As exemplified above, for designing of the energy trapping piezoelectric devices, how to suppress the level of the spurious resonance is the most important point. In the case where the piezoelectric device is the vibrator, the spurious resonance causes the jump of a vibrating frequency of the vibrator and unstable vibrating state. Moreover, in the case where the piezoelectric device is the filter, since a thickness vibration of a frequency higher than a pass band is easily propagated from the input to output sides, when the vibration is reflected at the end portion of the electrode, the spurious resonance forms an unnecessary pass band with a frequency which satisfies the resonance condition. As mentioned above, it is required that the electrode thickness and length are satisfies the condition so that the spurious resonance does not occur, but it cannot be always realized.

For example, the vibrator and filter with low impedance are required. This is because the vibrator causes stably vibration, and the filter make impedance adjustment with a circuit easy. The impedance can be decreased by increasing the electrode area, but the higher order mode is also resonated, and this causes the spurious resonance. The electrode size can be enlarged without spurious resonance by thinning the electrode thickness, whereas the ultra-thin electrode film has an unstable state such that fine electrode particles are locally coupled. For this reason, the thinning of the electrode thickness is limited. The lower limit of the electrode thickness depends on an electrode material, but a thickness of at least 50 nm is required for obtaining a practically stable electrode film. Moreover, when electrodes with large specific gravity made of gold, silver and the like is replaced by electrodes made of aluminum whose specific gravity is smaller, the mass load can be decreased. However the electrode made of aluminum changes more easily than the electrode made of gold and silver, and thus there arises a problem of long-period reliability. Furthermore, in the case where piezoelectric plates with a large electromechanical coupling factor made of piezoelectric ceramic, lithium tantalate and lithium niobate are used, even if the mass load of the electrodes is zero, a constant energy is trapped by the piezoelectric effect, and thus the upper limit of the electrode size in which the spurious resonance does not occur becomes fairly small. Therefore, the lowing the impedance of the device which ensures no spurious resonance and stable operation is limited.

In the case where a frequency is higher, the wavelength of the thickness vibration becomes short, so it is necessary to relatively reduce the mass load due to the electrodes. Therefore, it is necessary to suppress the spurious resonance by thinning the electrode or by reducing the electrode area, if the electrode cannot be thinned.

In addition, in the conventional energy trapping piezoelectric device, since the taking-out section of the electrode is also mass-loaded, the thickness vibration is propagated through the taking-out section of the electrode and reflected from an unexpected place, thereby causing the spurious resonance. Since it is difficult to analytically design the behavior of the taking-out section, the trial production has been repeated so that the design is determined.

3. SUMMARY OF THE INVENTION

It is an object of the present invention to realize a structure which simplifies a trapping design of an energy trapping piezoelectric device, and more specifically, to provide an energy trapping piezoelectric device in which freely electrode design, easy suppressing of unnecessary spurious resonance, response to a higher frequency with lower impedance and a filter with excellent channel selection can be realized, and provide a producing method thereof.

A piezoelectric device of the present invention comprises: a piezoelectric plate used for a thickness vibration; a single pair or a plural pairs of exciting electrodes for exciting a thickness vibration, said exciting electrode being provided to both surfaces of said piezoelectric plate; and an energy trapping load for substantially trapping a vibrating energy generated by the thickness vibration, wherein said energy trapping load is provided to the inside or outside of said exciting electrode.

A method of producing a piezoelectric device of the present invention comprises the steps of: providing an energy trapping load for substantially trapping a vibrating energy generated by a thickness vibration to a portion on a piezoelectric plate where the thickness vibration is generated; and providing a single pair or a plural pairs of exciting electrodes for exciting the thickness vibration to both surfaces of the piezoelectric plate to which the energy trapping load has been provided.

A method of producing a piezoelectric device of the present invention comprises the steps of: providing a single pair or a plural pairs of exciting electrodes for exciting a thickness vibration to both surfaces of a piezoelectric plate; and providing an energy trapping load for substantially trapping an vibrating energy generated by a thickness vibration onto the exciting electrode.

A method of producing a piezoelectric device of the present invention comprises the steps of: providing an energy trapping load pattern for substantially trapping a vibrating energy generated by a thickness vibration to at least one side of a piezoelectric plate where the thickness vibration is generated; and providing an exciting electrode pattern for exciting the thickness vibration to both sides of the piezoelectric plate.

4. BRIEF DESCRIPTION OF THE DRAWINGS

FIGS. 1(A), 1(B) and 1(C) are respectively a top view, cross sectional view and rear view showing an energy trapping piezoelectric device according to embodiment 1 of the present invention.

FIGS. 2(A)–2(F) show a method of producing the energy trapping piezoelectric device according to embodiment 1 of the present invention.

Figure 3A:
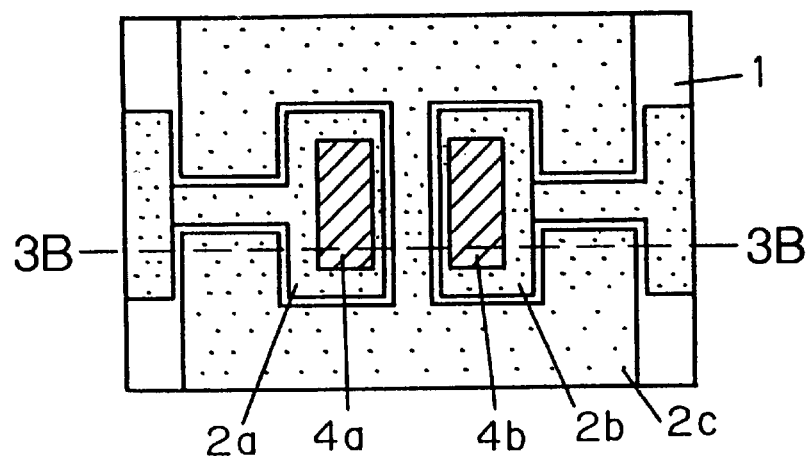
Figure 3B:
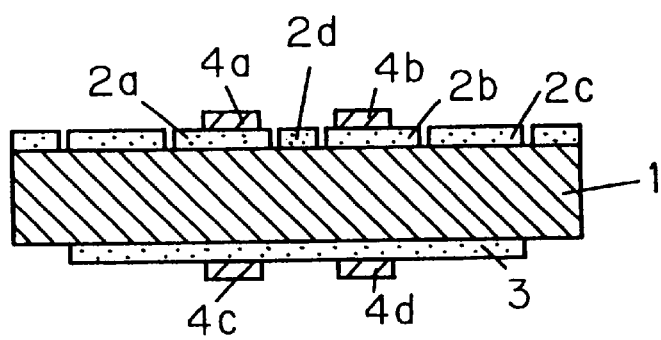
Figure 3C:
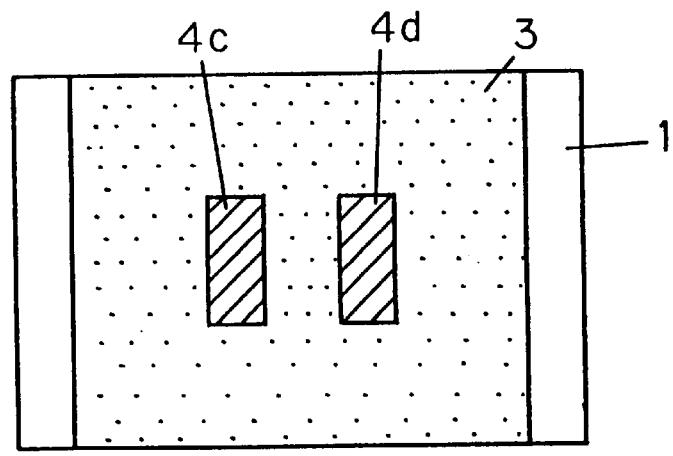

FIGS. 3(A), 3(B) and 3(C) are respectively a top view, cross sectional view and rear view showing the energy trapping piezoelectric device according to embodiment 2 of the present invention.

Figure 4A:
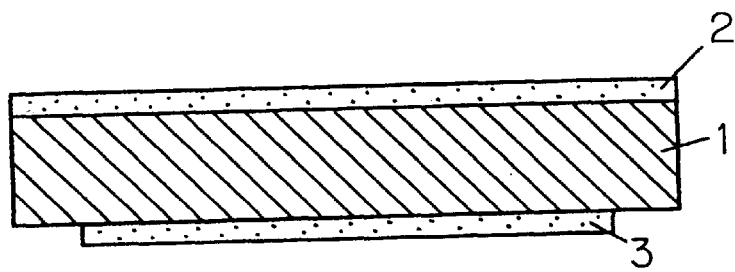
Figure 4B:
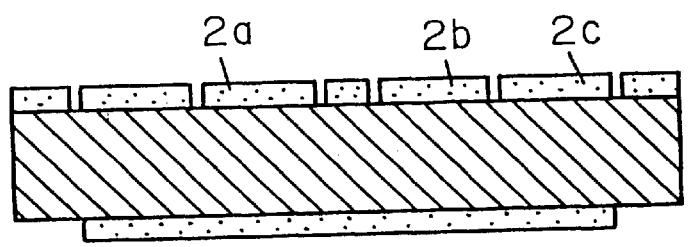
Figure 4C:
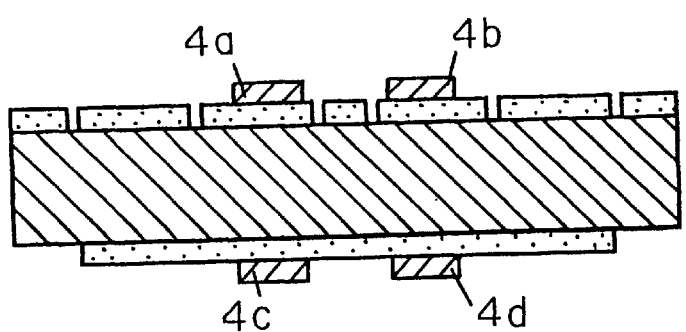

FIGS. 4(A)–4(C) show a method of producing the energy trapping piezoelectric device according to embodiment 2 of the present invention.

Figure 5A:
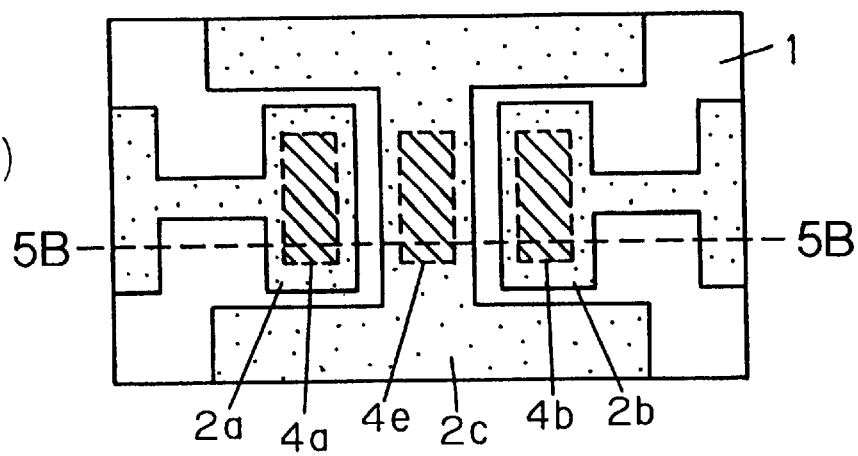
Figure 5B:
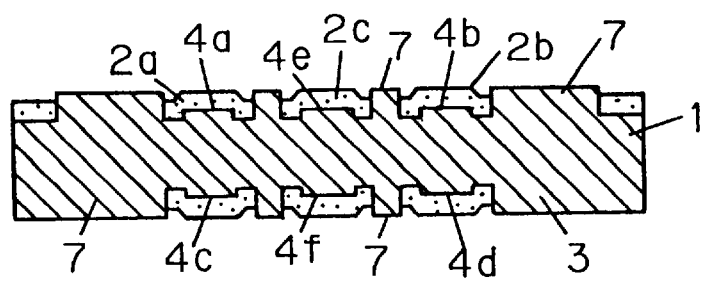
Figure 5C:
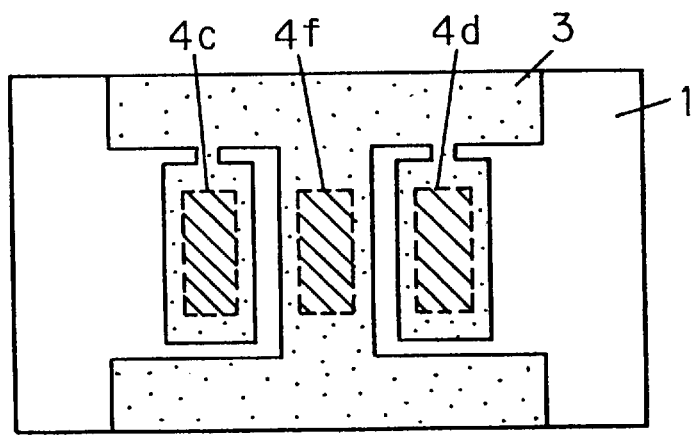

FIGS. 5(A), 5(B) and 5(C) are respectively top view, cross sectional view and rear view showing the energy trapping piezoelectric device according to embodiment 2 of the present invention.

FIGS. 6(A)–6(D) show a method of producing the energy trapping piezoelectric device according to embodiment 3 of the present invention.

FIGS. 7(A)–7(D) show a method of producing the energy trapping piezoelectric device according to embodiment 3 of the present invention.

FIGS. 8(A)–8(D) show a method of producing the energy trapping piezoelectric device according to embodiment 3 of the present invention.

Figure 9A:
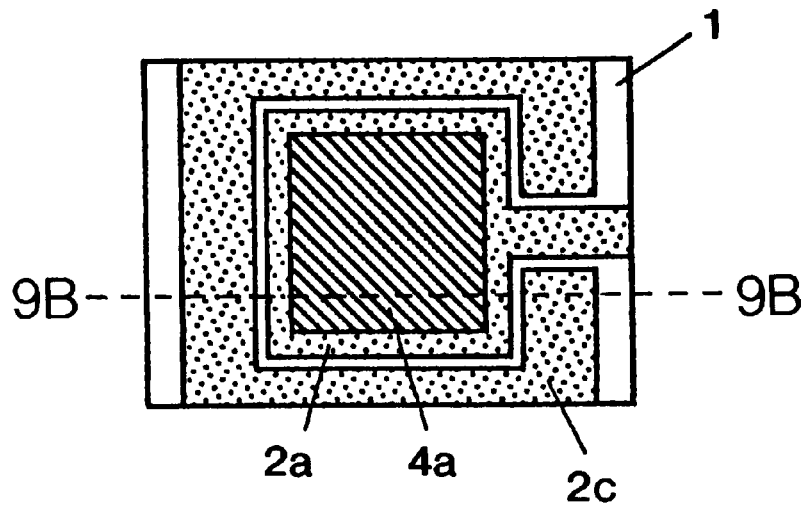
Figure 9B:
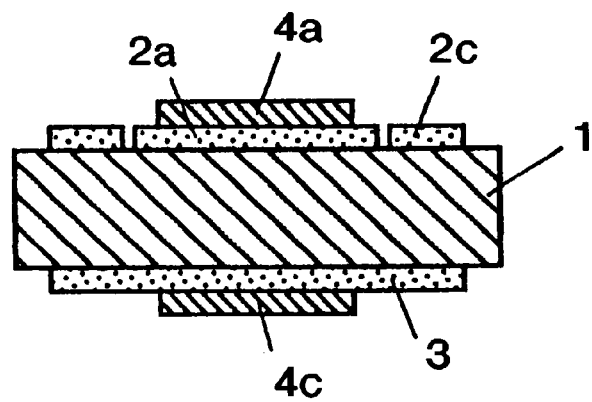
Figure 9C:
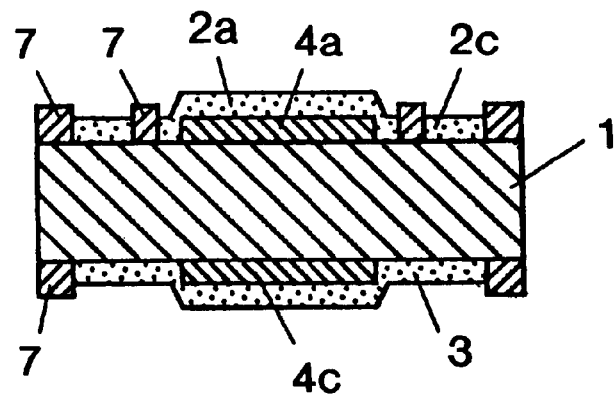

FIGS. 9(A), 9(B) and 9(C) are respectively a top view, cross sectional view and rear view showing the energy trapping piezoelectric device according to embodiment 2 of the present invention.

FIGS. 10(A), 10(B), 10(C) and 10(D) are respectively a top view, cross sectional view, examples of amplitude distribution in respective vibrating mode and a frequency chart showing a conventional energy trapping piezoelectric vibrator.

FIG. 11 is a perspective view showing a conventional energy trapping piezoelectric filter.

REFERENCE NUMERALS

1 Piezoelectric plate
2 Top electrodes
3 Bottom electrode
4 Projection (or Embossment)
5 Photo-resist
6 Photo-resist pattern
7 Projection between electrodes

5. DESCRIPTION OF THE PREFERRED EMBODIMENT

Embodiment 1

The following describes an energy trapping piezoelectric device according to one embodiment of the present invention on reference to FIGS. 1(A) through 1(C).

FIGS. 1(A) through 1(C) show examples of structures of a multi-mode piezoelectric filter according to embodiment 1 of the present invention, FIG. 1(A) is a top view of the multi-mode piezoelectric filter, FIG. 1(B) is a cross sectional view taken along line A–A' of FIG. 1(A), and FIG. 1(C) is a view viewed from a bottom surface.

As shown in the drawings, 1 is a piezoelectric plate, 2a is an input electrode, 2b is an output electrode, 2c is a top earth electrode, 3 is a bottom earth electrode, and 4a, 4b, 4c and 4d are projections formed on the top and bottom surfaces of the piezoelectric plate 1. These projections correspond to projections for trapping energy (energy trapping projections) according to the present invention. And also, these projections correspond to an energy trapping load according to the present invention. The input electrode 2a, output electrode 2b and top earth electrode 2c are positioned at very small intervals of several $\mu$m so as to cover the almost whole top surface of the piezoelectric plate 1, and the bottom electrode 3 covers almost whole bottom surface of the piezoelectric plate 1, and the electrode 2c is conducted to the bottom earth electrode 3 through the side of the piezoelectric plate 1.

Here, the input electrode 2a, output electrode 2b and top earth electrode 2c are also called the top electrode 2. Moreover, the top earth electrode 2c corresponds to a dummy electrode for controlling reflection of the present invention. Further, a pair of exciting electrodes composed of the input electrode 2a and bottom earth electrode 3 and another pair of exciting electrodes composed of the output electrode 2b and bottom earth electrode 3 correspond to a plural pairs of exciting electrodes formed on the piezoelectric plate of the present invention.

In such a manner, the projections 4a and 4c are brought into contact with the inner surfaces of the input electrode 2a and the bottom earth electrode 3, and the projections 4b and 4d are brought into contact with the inner surfaces of the output electrode 2b and the bottom earth electrode 3. For this reason, the piezoelectric device according of the present embodiment corresponds to the type of the piezoelectric device of the present invention having the projections for trapping the energy which are provided onto the insides of the exciting electrodes on a basis of the thickness direction of the piezoelectric plate 1.

Like the conventional device, the thickness vibration is reflected from the end surface of a single electrode, but when the electrodes are arranged just near the end surfaces of the electrodes and the distances between the electrodes is shortened in like manner of embodiment 1, the reflection from the end surfaces of the electrodes can be suppressed, and the vibration is not trapped by the electrodes.

Meanwhile, the projections 4a, 4b, 4c and 4d provided to the piezoelectric plate 1 are provided to a position which coincides with the portion where the thickness vibration is excited (generated) by the input and output electrodes 2a, 2b and the bottom earth electrode 3 (that is, a plural pairs of exciting electrodes ) at the top and bottom surfaces, vibration of practically fundamental symmetric mode and anti-symmetric mode is trapped by the mass loading effect of the projections.

The conventional piezoelectric filter was, as explained on reference to FIG. 11, arranged so that vibrations was trapped respectively by a pair of the input electrode 92a and the common earth electrode 93 and a pair the output electrode 92b and the common earth electrode 93.

On the contrary, the piezoelectric filter of the present embodiment is arranged so that vibration is practically trapped by the projections 4a through 4d provided to the piezoelectric plate 1. For this reason, a trapping design such that the fundamental symmetric mode and the anti-symmetric mode are trapped, and that the higher order mode is not trapped can realized by adjusting a shape and thickness of the projections, and thus dependence to the electrodes is decreased. Therefore, degree of freedom of the electrode design such as the size and thickness of the electrodes and electrode material becomes wide.

In the present embodiment, as shown in FIGS. 1(A) through 1(C), the areas of the input and output electrodes 2a and 2b are larger than the areas of the projections 4a and 4b. For this reason, since a vibration component which leaks from the trapped vibration by the projections into the circumference can be also generated efficiently, an efficient filter with lower input and output impedance can be arranged.

In addition, in the arrangement of the conventional piezoelectric device, namely, the arrangement which utilizes the vibration trapping by means of the mass load of an electrode, extremely light mass load which cannot be practically realized as the electrode thin film is required. However, if this cannot be realized in the conventional arrangement, according to the arrangement of the present embodiment, this can be realized. Namely, according to the arrangement of the present embodiment, since the mass load of the projections 4a through 4d for trapping the energy are lightened, vibration areas (corresponding to each area of the projections 4a through 4d for trapping the energy) can be enlarged, and the input and output impedance can be decreased.

Furthermore, aluminum should be used as the electrode material in the conventional arrangement, but according to the present embodiment, a stable electrode film made of gold, silver and the like can be used, and thus the electrode thickness can be thicken to a film thickness in which the characteristic is stable.

In the embodiment 1, since the electrodes are provided over the almost whole surface including the taking-out electrode section, the thickness vibration due to the taking-out electrode or the like which is the conventional problem is hardly reflected, and occurrence of the spurious resonance due to the electrodes can be suppressed. As a result, the electrodes can be taken out freely. Here, the reflection from the end portion of the electrodes becomes smaller as the distances between the electrodes are shortened, but as a standard, it is desirable that the distances between the electrodes are set so that a reflection attenuation at the end portions of the electrodes becomes larger than a spuriousness attenuation with respect to the pass band required as the filter characteristic. Here, as to the reflection attenuating by the end portions of the electrodes, the spuriousness in all the frequency bands to be blocked should be considered.

In the conventional energy trapping piezoelectric device, when a piezoelectric plate having a large coupling factor is used, even if the electrode mass is zero, the frequency of the electrode sections decreases greatly due to the piezoelectric effect. For this reason, it is necessary to make the electrodes to be small by all means to suppress the spuriousness, and thus the lowering of impedance is limited. Like the present invention, when the intervals between the divided electrodes are made be very small, frequency decrement between the divided electrodes can be made to be equal with each other, and the non-electrode section with high cut-off frequency can be made to be very small. Further, the reflection from the end portions of the electrodes due to the piezoelectric effect can be suppressed. Namely, even if the substrate with large coupling factor, the trapping design can be realized only by the mass load of the projections.

In addition, as described in the present embodiment, when the dummy electrode for suppressing the reflection provided around the input and output electrodes grounded, electric signal transmittance by a stray capacitance between the input and output electrodes can be reduced.

Even if the bottom projections 4c and 4d do not exist, the vibration can be trapped by the mass load only into the top projections 4a and 4b, and thus the aforementioned effect of the present invention can be obtained, but like the present embodiment 1, when two pairs of the projections are formed in the same positions of both the surfaces, the balance of the thickness vibration trapping becomes satisfactory, the generation of the unnecessary spurious vibration is suppressed more easily.

The following describes one example of the piezoelectric device producing method of the present invention on reference to FIGS. 2(A) through 2(F).

FIGS. 2(A) through 2(F) are diagrams showing the steps of producing the multi-mode piezoelectric filter according to the present embodiment 1. Moreover, FIGS. 2(A) through 2(F) correspond to the cross section A–A' of FIG. 1(A).

Namely, the respective producing steps are described below in order on reference to the following drawings.

Figure 2A:
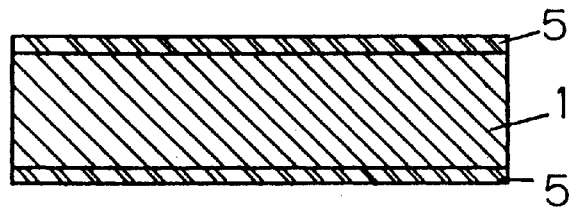

As shown in FIG. 2(A), an AT cut quartz having 0 frequency temperature factor was used as the piezoelectric plate 1, and a photo-resist 5 was applied to both the surfaces of the AT cut quartz and dried.

Figure 2B:
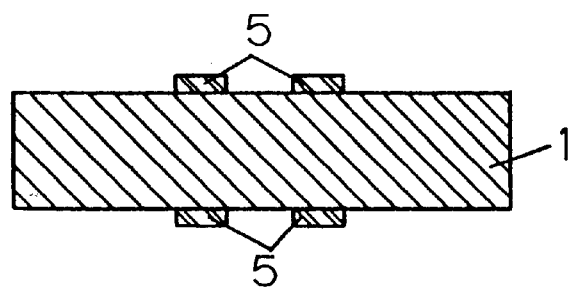

As shown in FIG. 2(B), a photo-mask was stuck to the top surface of the piezoelectric plate 1, ultraviolet rays which are nearly parallel with each other were projected onto the top surface, the photo-resists 5 on both the surfaces of the quartz were collectively exposed and developed, and the same photo-resist pattern was formed on both the surfaces of the quartz 1.

Figure 2C:
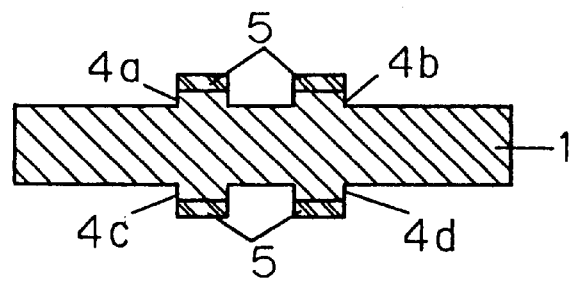

As shown in FIG. 2(C), both the surfaces of the quartz 1 were etched by *1 by using the photo-resist patterns 5 as a mask material, and the projections 4a and 4b and the projections 4c and 4d were formed on both the surfaces of the quartz 1.

Figure 2D:
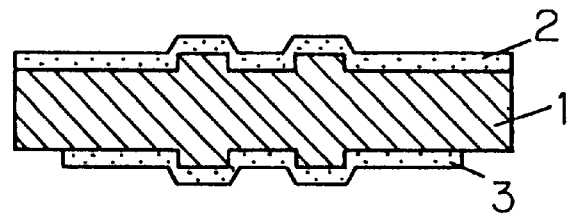

As shown in FIG. 2(D), the photo-resists 5 were peeled, and gold thin films of 100 nm using chrome as a ground material were deposited on both the surfaces of the quartz 1 as the top electrode 2 and bottom electrode 3.

Figure 2E:
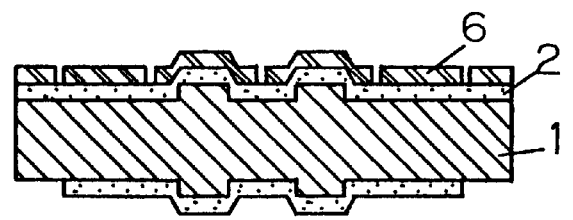

As shown in FIG. 2(E), a photo-resist pattern 6 was formed on the top electrode 2 by the photo-lithography method.

Figure 2F:
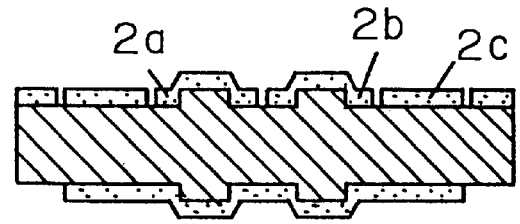

As shown in FIG. 2(F), electrode patterns 2a, 2b and 2c were formed by etch-removing a gap between the electrodes from the top electrode 2.

In FIGS. 1(A) and 2(A), one rectangular piezoelectric plate is shown, but the present invention is not limited to this. For example, needless to say, the present invention may have an arrangement such that a plurality of piezoelectric plates are collectively produced, Namely, in this case, rectangular piezoelectric plates which are larger than the piezoelectric plate shown in FIG. 1(A) and FIG. 2(A) are collectively produced by using the structure same as that of FIG. 1(A) as a repeating pattern, and they are cut into a size of the piezoelectric device. Then, the piezoelectric plates may be mounted into a surface mounting ceramic package by using a conductive paste.

According to the producing method of the present embodiment 1, when a transparent piezoelectric plate is used for a light source for exposing the photo-resist 6, the projections 4a and 4b and the projections 4c and 4d can be formed on the same positions of both the surfaces of the piezoelectric plate. Further, when the photo-lithography method is used for forming the electrode pattern, the gap between the electrodes can be made to be very small, and thus the reflection of the vibration from the electrode can be suppressed.

In the conventional method, the electrode pattern is formed by using a metal mask, but the accuracy is at most dozens $\mu$m, and like the present embodiment 1, the photo-lithography method enables the accuracy of sub $\mu$m. For this reason, according to the present embodiment, the high filter accuracy which has been demanded in recent years can be obtained, and high productivity stability can be realized.

In addition, the use of the metal mask makes the locating of the top and bottom electrodes difficult, and this causes scattering of the production. However, by using the photo-lithography method, the electrodes can be located accurately.

In general, the pattern formation using the photo-lithography method makes the production cost higher than that using the metal mask, but when a plurality of filters are collectively produced on a large piezoelectric plate in like manner of the embodiment 1, the photo-lithography method having excellent workability is advantageous.

In addition, in the embodiment 1, the pattern forming step is simplified such that the bottom electrode 3 wholly functions as an earth electrode. Also in the conventional arrangement, the bottom electrode can wholly function as an earth electrode, but the trapping effect by the bottom electrode is eliminated. Meanwhile, in the arrangement of the present invention, the vibration can be trapped into the projections 4a, 4b, 4c and 4d on both the surfaces, and the whole surfaces can function as an earth electrode without changing the trapping condition.

The forming method of the energy trapping load is not limited to the method of etching the piezoelectric plate 1, so for example, the thin film pattern for trapping an energy may be formed directly on the piezoelectric plate 1. In such a manner, when the load for trapping an energy is formed by the thin film pattern different from the electrode, the present invention can be applied to the piezoelectric plate which is etched difficultly.

Embodiment 2

The following describes the energy trapping piezoelectric device according to one embodiment of the present invention on reference to FIGS. 3(A) through 3(C) and FIGS. 4(A) through 4(C).

FIGS. 3(A) through 3(C) shows an example of the arrangement of the multi-mode piezoelectric filter according to embodiment 2. FIG. 3(A) is a top view, FIG. 3(B) is a cross sectional view taken along line A–A' of FIG. 3(A), and FIG. 3(C) is a bottom view. FIGS. 4(A) through 4(C) are flow diagrams showing the producing method according to embodiment 2, and they correspond to the cross section A–A' of FIG. 3(A). Next, the producing steps are explained in order on reference to the drawings.

As shown in FIG. 4(A), lithium tantalate single crystal was used as the piezoelectric plate 1, and gold thin films of 100 nm using chrome as a ground material were deposited on both the surfaces of the crystal as the top electrode 2 and the bottom electrode 3.

As shown in FIG. 4(B), electrode patterns 2a, 2b and 2c which separate the electrode 2 at small intervals were formed by the photo-lithography method.

As shown in FIG. 4(C), a silicon oxide thin film pattern was formed as the projections 4a, 4b, 4c and 4d in positions of both the surfaces where the vibration is trapped. The projections 4a, 4b, 4c and 4d correspond to the energy trapping thin film of the present invention. And also, these projections correspond to an energy trapping load according to the present invention.

A main difference in the arrangements between the embodiment 1 and embodiment 2 is that the projections 4a, 4b, 4c and 4d on both the surfaces are formed by the thin film pattern, and that a portion 2d of the earth electrode 2c is provided between the input electrode 2a and the output electrode 2b in the pattern of the top electrode.

In such a manner, the projections 4a and 4c formed by the thin film are provided respectively to the outer surfaces of the input electrode 2a and the bottom earth electrode 3, and the projections 4b and 4d formed by the thin film are respectively provided to the outer surfaces of the output electrode 2b and the bottom earth electrode 3. For this reason, the piezoelectric device of the present embodiment corresponds to the type of the piezoelectric device having the projections for trapping an energy which are provided to the outer sides of the exciting electrodes on a basis of the thickness direction of the piezoelectric plate 1.

In such a manner, when the projections 4a, 4b, 4c and 4d are formed by the thin film pattern, the thickness vibration can be trapped therein even on the piezoelectric plate made of a material such as lithium tantalate which is etched difficulty, and thus variety of plate materials can be used for the present invention.

Further, in the embodiment 2, the projections are formed on the electrodes, and this produces an effect such that a portion of the electrode where the thickness vibration occurs is protected. For example, in the case where an electrode material such as aluminum which is apt to deteriorate with age is used, if stable projections made of silicon oxide exist on the exciting electrodes, oxidation of the aluminum can be suppressed, and the deterioration with age which is the characteristic of the filter can be suppressed.

Needless to say, the projections 4a, 4b, 4c and 4d of the embodiment 2 may be formed by the method same as the method mentioned in the end of the embodiment 1 of forming the thin film pattern for trapping an energy directly on the piezoelectric plate 1. Also in this case, the effect same as the aforementioned one can be obtained.

In the case of this arrangement, if the piezoelectric plate and projections are transparent, the projections can be formed accurately in the same positions of both the surfaces by the method same as the embodiment 1.

When an earth pattern 2d is provided between the input and output electrodes 2a and 2b, the problem of the conventional electrode arrangement can be solved. The problem is such that a signal is electrically propagated by the stray capacitance between the input and output electrodes, and that isolation between the input and output cannot be obtained. Namely, the input electrode 2a is grounded by the stray capacitance between 2a and 2d, and output electrode 2b is grounded by the stray capacitance between 2b and 2d. For this reason, the direct and electrically coupling can be reduced. Such an earth electrode can be provided to the conventional filter, but if provided, an additional mass load is put on between the vibrators of the input and output, and thus the vibration trapping condition is changed. This possibly causes spuriousness. Meanwhile, in the present invention, the distance between the electrodes is made to be very small, and the vibration is practically trapped into the projections 4a, 4b, 4c and 4d. For this reason, even in the electrode arrangement of the embodiment 2, the vibration trapping condition is not changed, and a high-performance filter can be realized.

Embodiment 3

The following describes the energy trapping piezoelectric device according to one embodiment of the present invention on reference to FIGS. 5(A) through 5(C).

FIGS. 5(A) through 5(C) show an example of the arrangement of the multi-mode piezoelectric filter according to embodiment 3 of the present invention. FIG. 5(A) is a top view, FIG. 5(B) is a cross sectional view taken along line A–A' of FIG. 5(A), and FIG. 5(C) is a bottom view.

As shown in the drawings, 1 is a piezoelectric plate, 2a is an input electrode, 2b is an output electrode, 2c is a top earth electrode, 3 is a bottom earth electrode, 4a, 4b, 4c, 4d, 4e, 4f are projections formed on the top and bottom surfaces of the piezoelectric plate 1, and 7 is a projection between the electrodes. The present embodiment is different from the embodiments 1 and 2 in that the gaps between the top electrodes 2a, 2b and 2c are filled up by the projection between the electrodes 7. The projection between the electrode 7 has a thickness obtained substantially according to the following equation. Second reflection suppressing projections and a second reflection suppressing thin film according to the present invention correspond to the projections 7 between electrodes. FIG. 5(B) shows the case where the projections 7 between electrodes correspond to the second reflection suppressing projections of the present invention. The arrangement in the case where the projections 7 between electrodes correspond to the second reflection suppressing thin film of the present invention is shown in FIGS. 7(A) through 7(D) and FIGS. 8(A) through 8(D).

The thickness of the projection between electrode 7 is adjusted as shown in following equation.

$$\Delta fm = \Delta fm' + \Delta fp'$$

In this equation, $\Delta fm$, $\Delta fm'$ and $\Delta fp'$ are the frequency decrement factors due to mass load of projection between electrode, mass load of electrode and piezoelectric effect of electrode section, respectively.

Namely, the projection between electrode 7 is a projection having a mass load corresponds to the frequency decrement due to the electrodes, respective cut-off frequencies of the electrode section and non-electrode section can be made to be equal with each other on the border therebetween. As described on reference to FIG. 10(d), the thickness vibration to be trapped has a frequency between fc and fc', and there is not difference between the cut-off frequencies in the border between the electrode section and non-electrode section. This means that the vibrating mode which is reflected from the end portions of the electrodes and trapped does not practically exist. Therefore, the spuriousness due to the end portions of the electrodes can be suppressed.

Here, the cut-off frequency is a resonant frequency of the thickness vibration of a boundless plate in the case where a target portion is assumed to spread boundlessly.

According to the arrangement of the present embodiment 3, the reflection of the thickness vibration in the border between the electrode and non-electrode sections can be made to be very low. Namely, the thickness vibration is trapped only into the projections 4a, 4b, 4c, 4d, 4e and 4f, and thus the exciting electrode can be designed more freely.

For example, if the reflection of the thickness vibration from the end portions of the electrodes described in embodiments 1 and 2 is made to be very small extremely, it is necessary to extremely minimize gaps between electrodes (for example, the gap between the input electrode 2a and earth electrode 2c and a gap between the output electrode 2b and earth electrode 2c in FIG. 3(A)).

On the contrary, as mentioned above, the present embodiment 3 has an arrangement such that the second reflection suppressing projections or the second reflection suppressing thin films are placed between the electrodes without a gap, and as a result the reflection of the thickness vibration from the end portions of the electrodes can be suppressed. For this reason, it is not always necessary to provide a very small interval between the electrodes.

In other words, when only the second reflection suppressing projections and second reflection suppressing thin films are arranged, the electrode sections can be designed without caring the occurrence of the spuriousness due to the reflection of the thickness vibration from the end portions of the electrodes. For example, as shown in FIGS. 5(A) through 5(C), even if the intervals of the electrodes are not brought close to each other, or even if the earth electrode 2c is not provided close to the taking-out electrode sections of the input and output electrodes 2a and 2b, the reflection of the thickness vibration from the end portions and the taking-out sections of the electrodes pan be suppressed sufficiently. Therefore, it is not necessary to work the electrodes very finely, and the more simple production can be realized without using a photo-lithography device with a fine pitch.

Like the arrangement of embodiment 1, when the bottom electrode 3 exists also on the rear surface of the taking out electrodes of the exciting electrodes 2a and 2b, an excessive stray capacitance is added to between the taking-out electrode and the bottom electrode, and a capacity ratio of the vibrator is increased. As a result, there arises problems such that the range of the design of the filter is limited, and that an unnecessary thickness vibration is possibly excited also in a section where the taking-out electrode and the bottom electrode intersect each other. According to the embodiment 3, as shown in FIGS. 5(A) through 5(C), since even if the intersecting section of the taking-out sections of the input and output electrodes 2a and 2b and the bottom electrode 3 is eliminated, the reflection of the thickness vibration from the taking-out electrodes can be suppressed sufficiently, the degree of freedom of the design becomes larger than the embodiment 1, and thus unnecessary resonance can be suppressed.

Here, the arrangement of FIGS. 5(A)–5(C) show a filter having a so-called three-pole structure in which three energy trapping vibrators composed of projections 4a, 4b, 4c, 4d 4e and 4f are coupled, and the filter is constituted by using three vibrating modes: the basic symmetric mode and anti-symmetric mode, and the symmetric mode in which the phase of only the center vibrator is inverted. In such a manner, the effect of the present invention is not limited to a number of vibrators used in the filter and a number of modes, and can be applied to the piezoelectric filter having a larger number of poles.

The top earth electrode 2c in the piezoelectric filter of the present embodiment does not have a function as the dummy electrode 2c described in the embodiments 1 and 2. Namely, the top earth electrode 2c of the present embodiment has a function of the earth electrode only as one of the exciting electrodes.

The following describes three examples of the producing method of the piezoelectric filter according to the embodiment 3 as one embodiment of the method of producing the piezoelectric method of the present invention on reference to FIGS. 6(A) through 6(D), FIGS. 7(A) through 7(D) and FIGS. 8(A) through 8(D).

FIGS. 6(A) through 6(D) are diagrams showing a flow of the steps of producing the multi-mode piezoelectric filter according to the embodiment 3. The drawings correspond to the cross sectional view taken along line A–A' of FIG. 5(A).

First, the description is given as to the first example of the producing method on reference to the drawings.

Figure 6A:
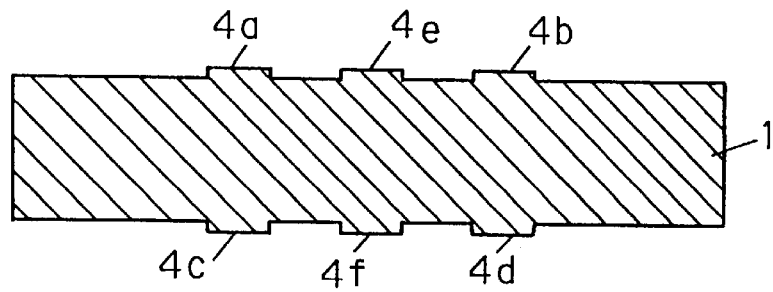

As shown in FIG. 6(A), an AT cut quartz was used as the piezoelectric plate 1, and the quartz was etched by the photo-lithography method to form projections 4a, 4b, 4c, 4d, 4e and 4f.

Figure 6B:
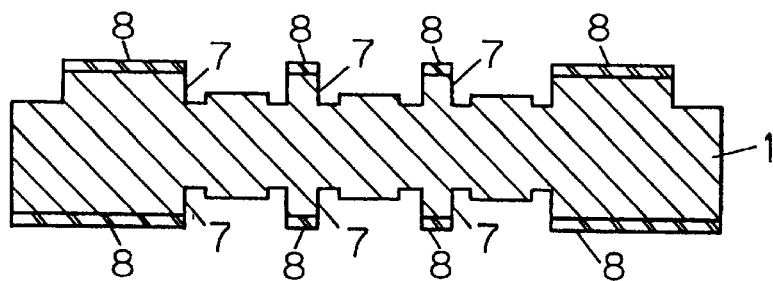

As shown in FIG. 6(B), photo-resist patterns 8 corresponding to the gaps between electrodes were formed respectively on the top and bottom surfaces of the quartz 1, and the projections 7 between the electrodes were formed by etching the quartz 1.

Figure 6C:
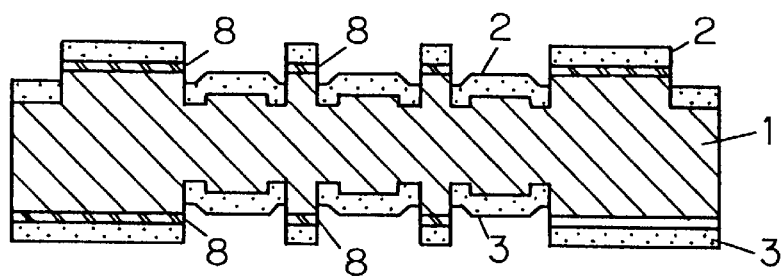

As shown in FIG. 6(C), a gold thin film of 100 nm using chrome as a ground material was deposited on both the surfaces.

Figure 6D:
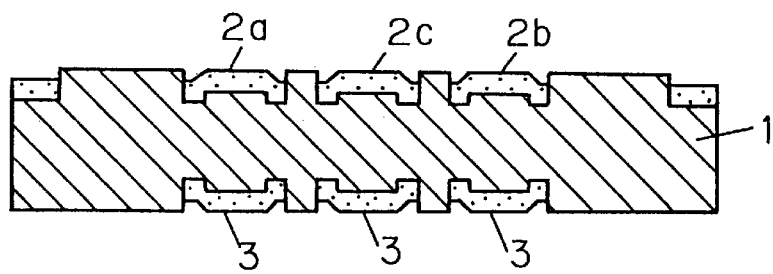

As shown in FIG. 6(D), the electrodes were lifted off by peeling and cleaning the photo-resists 8, and the electrode film patterns 2a, 2b, 2c and 3 were formed.

The following describes the second example on reference to FIGS. 7(A) through 7(D).

FIGS. 7(A) through 7(D) are cross sectional views showing a flow of the steps of producing the multi-mode piezoelectric filter described in the embodiment 3.

Figure 7A:
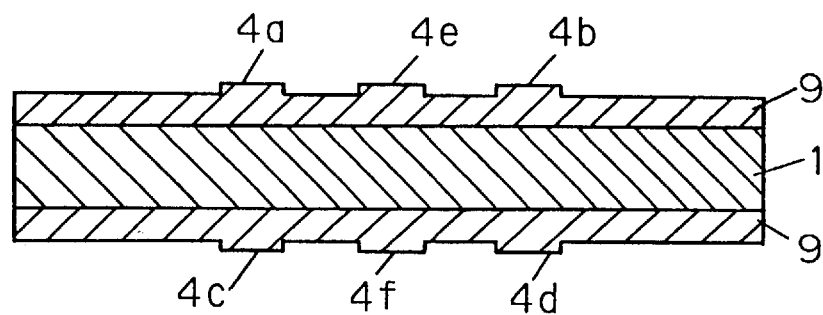

As shown in FIG. 7(A), lithium tantalate was used as the piezoelectric plate 1, and a silicon oxide thin film 9 was deposited on both the surfaces of the piezoelectric plate 1, and the silicon oxide thin film was etched by the photo-lithography method to form projections 4a, 4b, 4c, 4d, 4e and 4f.

Figure 7B:
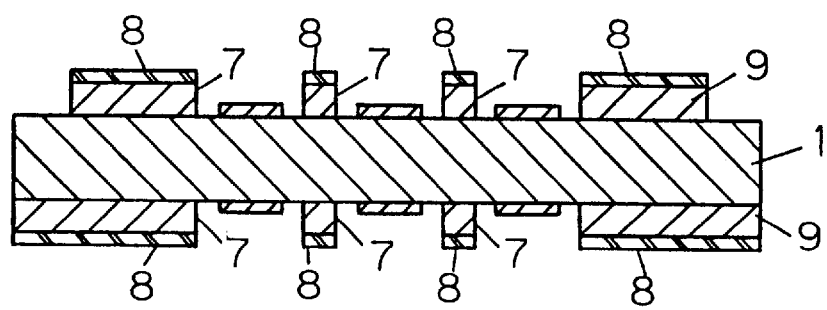

As shown in FIG. 7(B), photo-resist patterns 8 corresponding to the gaps between electrodes were formed on the top and bottom surfaces of the piezoelectric plate 1, and projections 7 between the electrodes were formed by etching the silicon oxide thin film.

Figure 7C:
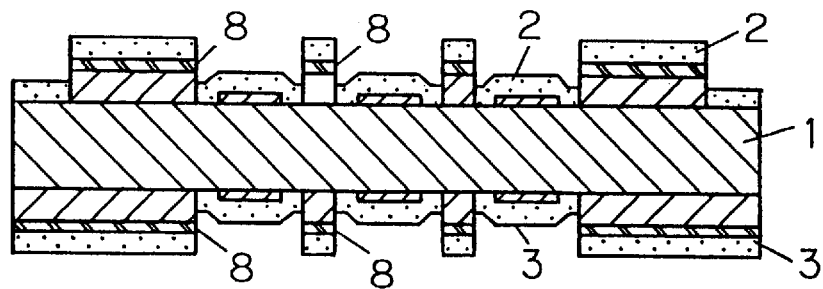

As shown in FIG. 7(C), a gold thin film of 100 nm using chrome as a ground material was deposited on both the surfaces.

Figure 7D:
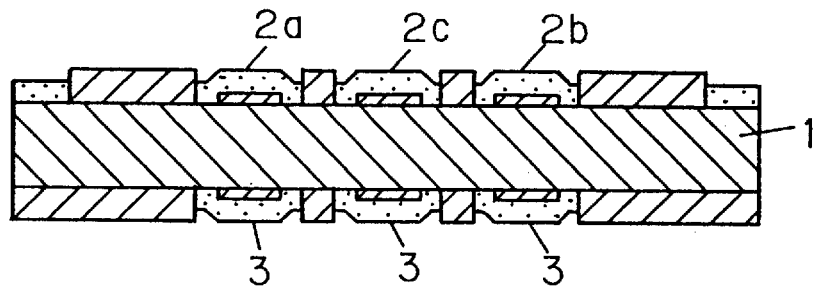

As shown in FIG. 7(D), the electrodes were lifted off by peeling and cleaning photo-resists 53 and 54, and electrode film patterns 2a, 2b, 2c and 3 were formed on both the surfaces.

The following describes the third example on reference to FIGS. 8(A) through 8(D).

FIGS. 8(A) through 8(D) are cross sectional views showing a flow of the steps of producing the multi-mode piezoelectric filter having the arrangement of the embodiment 3.

Figure 8A:
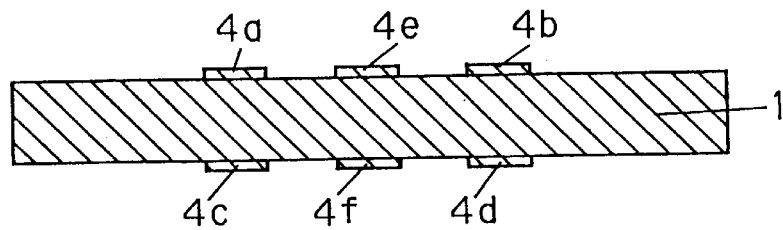

As shown in FIG. 8(A), an AT cut quartz was used as the piezoelectric plate 1, and the quartz was etched by the photo-lithography method to form projections 4a, 4b, 4c, 4d, 4e and 4f.

Figure 8B:
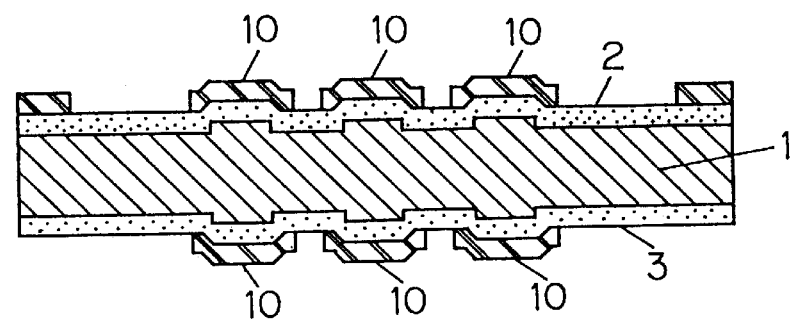

As shown in FIG. 8(B), a gold thin film of 100 nm using chrome as a ground material was deposited on both the surfaces of the quartz 1, and photo-resist pattern 10 corresponding the electrode pattern were formed.

Figure 8C:
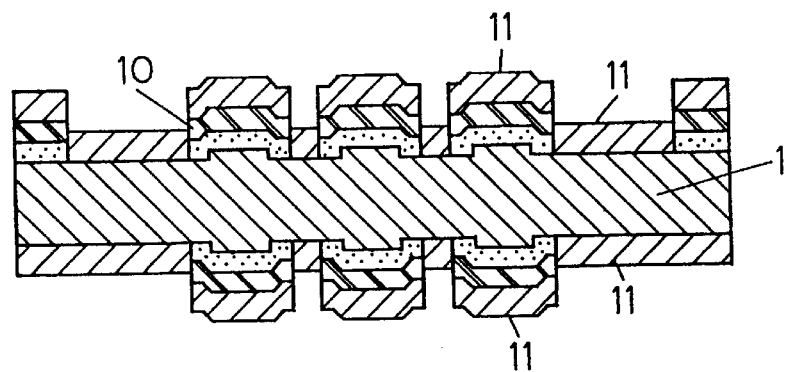

As shown in FIG. 8(C), the electrodes were etched by using the photo-resists 10 as a mask, and a silicon oxide thin film 11 was formed on both the surfaces.

Figure 8D:
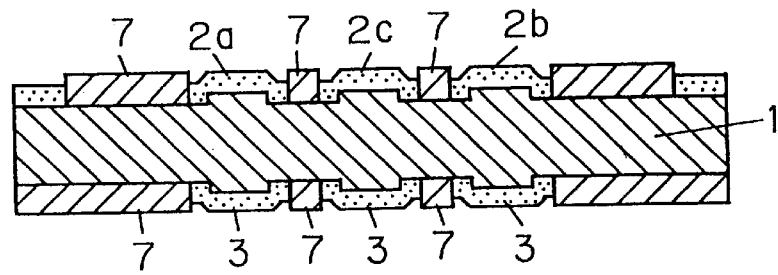

As shown in FIG. 8(D), the silicon oxide thin film 11 was lifted off by peeling and cleaning the photo-resists 10, and projections between the electrodes were formed on both the surfaces.

According to the above three producing methods, since the gaps between the electrode patterns are filled up by the projections between the electrodes completely, the reflection of the vibration from the end portions of the electrodes can be suppressed on the whole of both the surfaces of the vibrator, and the multi-mode piezoelectric filter which seldom generates spuriousness can be realized.

Embodiment 4

In the embodiments 1 through 3, as the energy trapping piezoelectric device of the present invention, the multi-mode piezoelectric filter in which vibrations of a plurality of vibrators are coupled was exemplified, but even when the present invention is applied to a single vibrator, the same effect can be obtained.

The following describes the energy trapping piezoelectric vibrator which is one embodiment of the piezoelectric device of the present invention on reference to FIGS. 9(A) through 9(C), and also describes the producing method thereof.

FIG. 9(A) is a top view of the energy trapping piezoelectric vibrator according to the present embodiment, and FIG. 9(B) is a cross sectional view taken along line A–A' of FIG. 9(A).

In addition, FIG. 9(C) is another example which is different from the energy trapping piezoelectric vibrator of FIG. 9(A), and it is a cross sectional view taken along line A–A' of FIG. 9(A) in the case where the dummy electrode and the projections between the electrodes are provided. As shown in FIG. 9(A), a lithium tantalate single crystal was used as the piezoelectric plate 1, and gold thin films of 100 nm using chrome as a ground material was deposited as the top electrode 2 and bottom electrode 3 on both the surfaces of the signal crystal.

As shown in FIG. 9(B), electrode patterns 2a and 2c which divides the electrode 2 at very small intervals were formed by the photo-lithography method. Here, the electrode pattern 2c corresponds to the reflection suppressing dummy electrode of the present invention which was insulated electrically from a exciting electrode and was formed on the piezoelectric plate separately from the exciting electrode at a predetermined interval.

As shown in FIG. 9(C), as projections 4a and 4c, a silicon oxide thin film pattern was formed on both the surfaces of a vibration trapping section. Here, the piezoelectric vibrator having the arrangement shown in FIG. 9(C) corresponds to one having the reflection suppressing dummy electrode and the first reflection suppressing thin film of the present invention. Moreover, the arrangement of FIG. 9(C) is different from that of FIG. 9(B) in that the projections 4a and 4c corresponding to the energy trapping load of the present invention are formed as thin films on the piezoelectric plate. Moreover, a pair of exciting electrodes composed of the input electrode 2a and bottom earth electrode 3 corresponds to a single pair of exciting electrodes formed on the piezoelectric plate of the present invention.

The arrangements of FIGS. 9(A) and 9(B) are examples in which the arrangement and producing method of the embodiment 2 are applied to the piezoelectric vibrator. The top electrode 2 is divided separately from the exciting electrode, taking-out electrode 2a and dummy electrode 2c at very small intervals, and it suppresses the reflection of the vibration from the end surface of the electrode 2a. Therefore, the energy is practically trapped by the projections 4a and 4c. The projections 4a and 4c may be directly provided onto the piezoelectric plate 1, and similarly to the embodiment 1, the projections 4a and 4c may be provided by etching the piezoelectric plate. As a result, the similar effect can be obtained without changing its function.

Meanwhile, the arrangement of FIG. 9(C) is such that the method (mainly FIG. 7(A) through 7(D)) similar to the embodiment 3 is used for the piezoelectric vibrator, and that the projections 7 between the electrodes are provided into the gaps between the electrodes.

In other words, in the arrangement of FIG. 9(C), when the projections between the electrodes are provided into the very small gaps between the exciting electrode and dummy electrode described in FIG. 9(B), similarly to the embodiment 3, the reflection of the vibration from the end portions of the electrodes can be suppressed more efficiently.

In the arrangement of FIG. 9(C), the description was given as to the case the projections 4a and 4c are formed as thin films on the piezoelectric plate, but the present invention is not limited to this, so as shown in FIG. 9(B), needless to say, the thin films as the energy trapping load may be formed on the exciting electrode. In this case, similarly to the contents shown in FIG. 4(C) in the embodiment 2, the piezoelectric vibrator can be produced by forming the electrode patterns on both the surfaces and then by providing the energy trapping load.

In any of the aforementioned arrangements, since the energy of the piezoelectric vibrator is practically trapped into the projections 4a and 4c, the trapping design which suppresses the spuriousness can be made according to the shape and thickness of the projections, and the dependence on the electrodes is decreased.

Therefore, the degree of freedom of the electrode design such as a size, thickness and material of the electrodes becomes large. The exciting electrode 2a can be made to be larger than the projection 4a, the vibration component which leaks out can be vibrated efficiently due to the vibration trapping into the projections. As a result, the impedance can be further decreased.

In addition, the present invention can produce a mass load which is too light to obtain as an electrode thin film by means of the vibrating trapping by the mass load of the conventional electrodes. The vibration area can be made to be large by lightening the mass load, and thus the impedance can be decreased.

Further, even in the conventional case where aluminum should be used, a stable electrode film such as gold and silver can be used, and thus the thickness of the electrode can be thicken to a thickness that the characteristic becomes stable.

In addition, since the electrodes are provided to the whole surface including the taking-out electrode section, the reflection of the thickness vibration due to the taking-out electrode or the like, which is the problem of the conventional arrangement, hardly occurs. As a result the occurrence of the spuriousness due to the electrodes can be suppressed, and thus the electrodes can be taken out freely.

As the intervals between the electrodes is made to be small, the vibration reflection from the end portion of the electrodes is decreased, but it is desirable that the intervals of the electrodes is set basically so that a suppressing quantity of the reflection from the end portions of the electrodes becomes larger than a desired suppressing quantity of the spuriousness. Here, the reflection suppressing from the end portions of the electrodes should be considered as to all spuriousness in frequency bands to be suppressed.

In the conventional manner, since the trapping by the piezoelectric effect becomes large in the piezoelectric plate having large coupling factor, it is necessary to reduce the electrode in size by all means, so the lowering of the impedance is limited. In the present invention, since a decrement of frequencies of the exciting electrode section and dummy electrode section are equal with each other, the trapping design can be made only according to the mass load of the projections.

As described in the embodiment 4, the effects of the embodiments 1 through 3 are not limited to the multi-mode piezoelectric filter, so the present invention can be widely applied to the energy trapping piezoelectric device such as a vibrator, and the same effects can be obtained.

In addition, when the piezoelectric filter having the above arrangement is used in a wireless communication device such as a portable telephone, the high-frequency section is arranged by a filter having excellent characteristic in which unnecessary spuriousness is suppressed and a degree of freedom of design is large. For this reason, a wireless communication device in which the selectivity of adjacent channels is large and which is hardly influenced by an interference radio wave can be realized. When the piezoelectric vibrator having the above arrangement is used in an information device and communication device, a clock can be generated by the vibrator having stable characteristic having little spuriousness. Therefore, an information device and communication device in which a reference frequency and operation are stable can be realized.

In the embodiments 1 through 4, quartz, lithium tantalate and lithium niobate were used as a piezoelectric material, the present invention is not limited by the piezoelectric materials, so piezoelectric materials composing the energy trapping multi-mode piezoelectric filter can produce the same effects.

In addition, in the above embodiments described the arrangements having not only the energy trapping load but also the reflection suppressing load such as the dummy electrode, reflection suppressing projections or reflection suppressing thin films, but the present invention is not limited to them, so the above reflection suppressing load may not be provided. Namely, compared with the conventional arrangement that the energy is trapped by the exciting electrode, the piezoelectric device having the aforementioned energy trapping load generates less unnecessary spurious vibration. Therefore, the reflection suppressing load is not always required.

In addition, the above embodiments described the arrangement that the electrodes on both the surfaces of the piezoelectric plate are divided, but the present invention is not limited to this, so needless to say, only the electrodes on one of the surfaces may be divided.

In addition, the above embodiments described the arrangement that the energy trapping load is always formed on the surface of the piezoelectric plate where the electrode is divided, but the present invention is not limited to this, so the energy trapping load may be formed only on the surface where the electrode is not divided.

In addition, the reflection suppressing dummy electrode of the present invention is formed by using the electrode material same as the exciting electrode in the aforementioned embodiments, but the present invention is not limited to this, so for example, another electrode materials or completely another materials such as insulating materials can be used.

In addition, the energy trapping load of the present invention is set to be larger than the area of the exciting electrode in the aforementioned electrode, but the present invention is not limited to this, so for example, its area may be the same as that of the exciting electrode.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meters and bounds of the claims, or equivalence of such metes and bounds thereof are therefore intended to be embraced by the claims.

What is claimed is:

1. A piezoelectric device comprising:
   a piezoelectric plate used for a thickness vibration;
   a single pair or plural pairs of exciting electrodes for exciting the thickness vibration of said piezoelectric plate, said exciting electrodes being provided over a first and second surface of said piezoelectric plate;
   reflection suppressing load for suppressing generation of a reflection of the thickness vibration at least on an outer peripheral area adjacent an end portion of said exciting electrodes, said reflection suppressing load provided to at least a partial area of said piezoelectric plate other than an area to which said exciting electrodes are provided, and
   an energy trapping load for substantially trapping a vibrating energy generated by the thickness vibration,
   wherein said energy trapping load is provided adjacent said exciting electrodes.

2. The piezoelectric device according to claim 1, wherein said energy trapping load is provided to an inside of said exciting electrodes and is one of an energy trapping projection and a thin film provided to at least one surface of said piezoelectric plate.

3. The piezoelectric device according to claim 1, wherein said reflection suppressing load is immediately adjacent said exciting electrodes.

4. The piezoelectric device according to claim 1, wherein said reflection suppressing load is a reflection suppressing dummy electrode which is electrically insulated from said exciting electrodes and is provided on said piezoelectric plate separately from said exciting electrodes at a predetermined interval.

5. The piezoelectric device according to claim 1, said reflection suppressing load including:
   (1) a reflection suppressing dummy electrode which is electrically insulated from said exciting electrodes and provided to said piezoelectric plate separately from said exciting electrodes at a predetermined interval, and
   (2) at least one of a first reflection suppressing projection and a first reflection suppressing thin film which is provided between said exciting electrodes and the reflection suppressing dummy electrode which are separated from each other by the predetermined interval, and
   wherein a cut-off frequency of the thickness vibration of a portion of said piezoelectric plate where at least one of said first reflection suppressing projection and first reflection suppressing thin film is provided (1) is substantially the same as a cut-off frequency of the thickness vibration of a portion where said exciting electrodes are provided and (2) is substantially the same as a cut-off frequency of the thickness vibration of a portion of said piezoelectric plate where said reflection suppressing dummy electrode is provided.

6. The piezoelectric device according to claim 1, wherein said reflection suppressing load includes at least one of a second reflection suppressing projection and a second reflection suppressing thin film which is substantially adjacent to said exciting electrodes, and
   a cut-off frequency of the thickness vibration of a portion where at least one of said second reflection suppressing projection and said reflection suppressing thin film is provided is substantially the same as a cut-off frequency of the thickness vibration of a portion of said piezoelectric plate where said exciting electrodes are provided.

7. The piezoelectric device according to claim 4, wherein on both end portions of said exciting electrodes and reflection suppressing dummy electrode which face each other at the predetermined interval, reflection of an undesired vibrating mode is suppressed.

8. The piezoelectric device according to claim 5, wherein when a decrement of the cut-off frequency due to a mass load of said reflection suppressing projection is F1, a decrement of the cut-off frequency due to a mass load of said exciting electrodes is F2, and a decrement of the cut-off frequency due to a piezoelectric effect of said exciting electrodes is F3, a height H, from a reference surface, of said reflection suppressing projection is set to a value which satisfies F1=F2+F3.

9. The piezoelectric device according to claim 2, wherein said energy trapping load is formed in substantially a same position on both sides of said piezoelectric plate.

10. The piezoelectric device according to claim 1, wherein said plural pairs of said exciting electrodes are provided on said piezoelectric plate and said plural pairs of exciting electrodes function as a filter.

11. The piezoelectric device according to claim 10, wherein
   an earth electrode is provided between and separate from said exciting electrodes at a predetermined interval, and
   on both end portions adjacent said exciting electrode and said earth electrode which face each other at the predetermined interval, reflection of an undesired vibrating mode is suppressed.

12. The piezoelectric device according to claim 1, wherein said reflection suppressing load is displaced from said exciting electrodes by a predetermined distance.

13. The piezoelectric device according to claim 1, wherein said energy trapping load is provided to an outside of said exciting electrodes and is an energy trapping thin film provided to the exciting electrodes formed on at least one surface of said piezoelectric plate.

* * * * *

UNITED STATES PATENT AND TRADE MARK OFFICE
CERTIFICATE OF CORRECTION

PATENT NO.   : 5,969,463
DATED        : October 19, 1999
INVENTOR(S)  : Tomita et al.

It is certified that error appears in the above-identified patent and that said Letters Patent is hereby corrected as shown below:

Column 17, line 36, before "reflection" insert --a--

Column 18, after line 65, insert:

--14. A mobile communication device using the piezoelectric device of claim 1.--

Signed and Sealed this

Nineteenth Day of December, 2000

Attest:

Q. TODD DICKINSON

Attesting Officer

Commissioner of Patents and Trademarks